United States Patent [19]

Elarde

[11] Patent Number: 4,689,103

[45] Date of Patent: Aug. 25, 1987

[54] METHOD OF MANUFACTURING INJECTION MOLDED PRINTED CIRCUIT BOARDS IN A COMMON PLANAR ARRAY

[75] Inventor: Vito D. Elarde, San Diego, Calif.

[73] Assignee: E. I. Du Pont de Nemours and Company, Wilmington, Del.

[21] Appl. No.: 798,871

[22] Filed: Nov. 18, 1985

[51] Int. Cl.$^4$ ............................................. B29C 45/03
[52] U.S. Cl. ..................................... 156/242; 156/245; 156/304.5; 29/848; 29/849; 29/852; 206/557; 206/563; 206/564; 264/328.1; 264/328.2; 264/328.8; 361/412; 361/414; 439/85; 439/55
[58] Field of Search ............ 156/242, 245, 293, 304.5; 29/829, 830, 848, 849, 852; 174/68.5; 264/328.1, 328.2, 328.8; 428/901; 53/169, 246, 250; 339/17 B, 17 LC, 17 LM, 17 M; 361/397, 412, 414; 206/557, 558, 562, 563, 564, 565; 427/96, 97, 98, 99, 250

[56] References Cited

U.S. PATENT DOCUMENTS

| | | | |
|---|---|---|---|
| 2,049,523 | 8/1936 | Sponable | 156/304.5 |
| 2,553,227 | 5/1951 | Wesner | 156/304.5 |
| 3,780,431 | 12/1973 | Feeney | 339/17 B |
| 4,210,243 | 7/1980 | McDowell | 206/564 |
| 4,410,574 | 10/1983 | Battochio | 361/412 |
| 4,532,152 | 7/1985 | Elarde | 29/848 |
| 4,549,200 | 10/1985 | Ecker et al. | 361/414 |
| 4,572,367 | 2/1986 | Uslar | 206/563 |
| 4,591,220 | 5/1986 | Impey | 29/848 |

Primary Examiner—Caleb Weston

[57] ABSTRACT

A plurality of physically separate plastic substates are injection molded, each with at least one pattern of channels formed in a surface of thereof defining a conductive circuit to be formed. The plurality of substrates are then physically connected in a common planar array either by inserting them in corresponding receptacles in a carrier board, by mating peripheral connecting elements, by using adhesive or by some other suitable connecting mechanism. Where a carrier board with pre-formed receptacles is not utilized, the individual substrates in the array are pierced and replaced. The planar array is processed to simultaneously form a conductive circuit on each substrate consisting of metal deposited in its pattern of channels. The planar array of metallized substrates may then be stuffed with electronic components on an automatic insertion machine, wave soldered. The individual finished circuit boards are then pressed out. This batch processing results in substantial savings in handling costs and avoids the significant expense and tolerance problems associated with using very large molds which would be required to form the large planar array directly.

10 Claims, 8 Drawing Figures

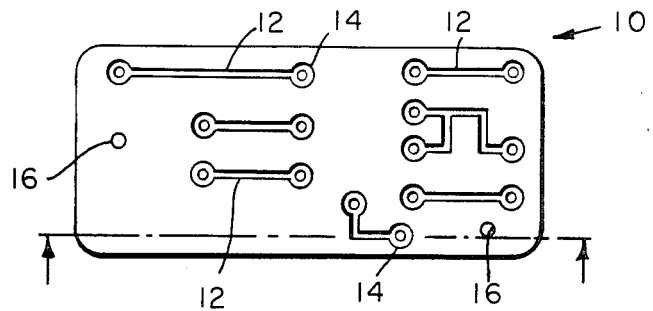
FIG. 1
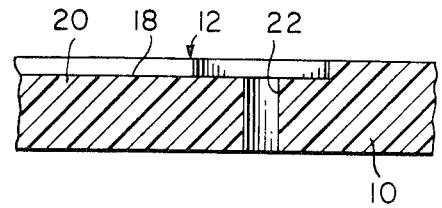
FIG. 2
FIG. 3
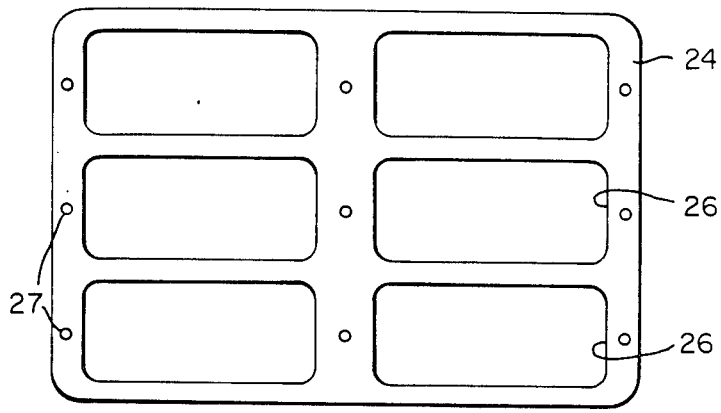
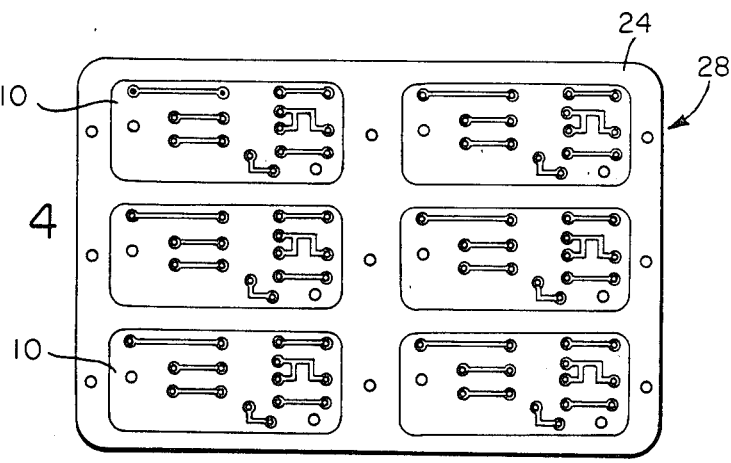
FIG. 4

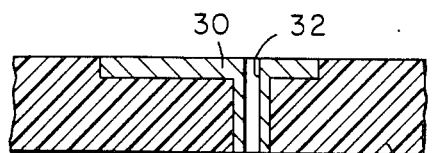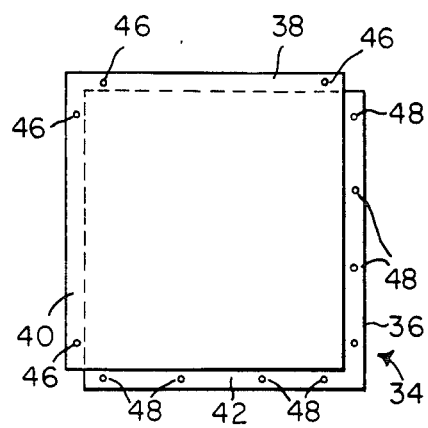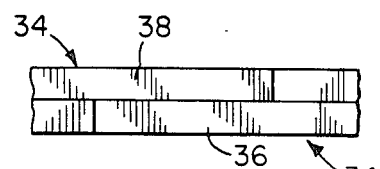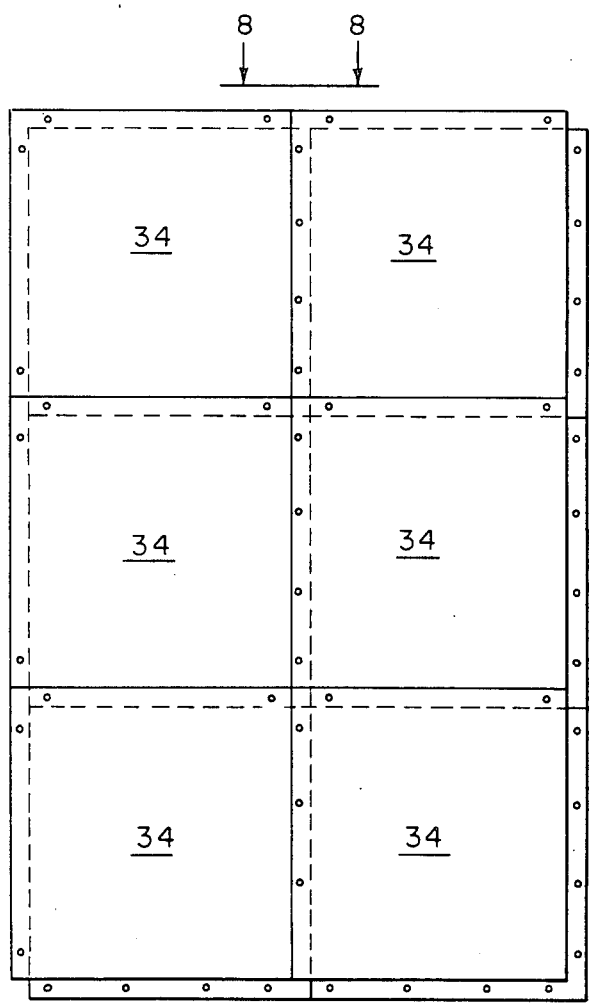

METHOD OF MANUFACTURING INJECTION MOLDED PRINTED CIRCUIT BOARDS IN A COMMON PLANAR ARRAY

BACKGROUND OF THE INVENTION

The present invention relates to the fabrication of circuit boards for supporting and interconnecting electronic components, and more particularly, to a method of mass producing metallized injection molded plastic substrates that results in substantial savings in tooling and handling costs.

Conventional printed circuit boards are fabricated from sheets of copper clad FR-4 epoxy glass bonded laminate substrate material. The substrate material is drilled to provide component lead holes, and then scrubbed and deburred. A thin layer of copper is deposited on the substrate through electroless plating in order to metallize the holes. Thereafter photoresist masking and imaging processes are used to delineate the desired conductive pattern. A relatively thick layer of copper or other metal is deposited through electro-plating and then chemical etching is done to remove the excess copper, leaving the desired conductive patterns on the substrate.

The aforementioned conventional process for fabricating printed circuit boards is labor intensive, requires substantial expenditures for heavy equipment, has time consuming multiple steps, and in addition produces effluents which must be specially handled to reduce environmental hazards. Significant percentages of defective circuit boards can result unless close registration tolerances are maintained during the drilling, masking and imaging steps.

In my U.S. Pat. No. 4,532,152 entitled "Fabrication of a Printed Circuit Board with Metal-Filled Channels" there are disclosed various processes of fabricating a printed circuit board by injection molding a plastic substrate to provide holes and channels therein. The channels are metallized to delineate a recessed conductive pattern. These processes have significant advantages in that the drilling, routing, deburring, masking and imaging steps are eliminated. The resulting printed circuit boards are thus cheaper to produce and have less defects that conventional FR-4 laminate printed circuit boards.

Conventional printed circuit boards are often photolithographically delineated in large arrays on a single large sheet of copper clad FR-4 laminate substrate. Sections of the large single sheet, each containing an individual circuit, are then "pierced and replaced", i.e. a cutting die is used to stamp out the sections which are then re-inserted snugly into the resulting receptacles. These arrays are then shpped to customers. A plurality of the circuit boards are then simultaneously plugged or "stuffed" with electronic components by the customer using an automatic insertion machine and then wave soldered. The individual boards are then pressed out of their receptacles by the customer.

Printed circuit boards must conform to an industry standard, which usually requires a one-sixteenth inch thickness. When injection molded printed circuit boards are produced, it is important that the boards have a controlled uniform thickness and that the channels and holes are accurately formed. Molds can be made that will delineate an arraya of individual circuit boards on a common substrate so that the individual boards may be simultaneously pierced and replaced, metallized, plugged, stuffed, wave soldered and then pressed out. However, if the surface area of the array becomes too large, the cost of the tooling becomes prohibitive, the pressure required in the injection molding machine becomes very large, and it becomes increasingly difficult to maintain the necessary tolerances. By way of example, at the present time it is economically feasible to produce molds that can be used to simultaneously form eight identical circuit boards measuring approximately three and one-quarter inches by one and three-quarter inches on a single common substrate measuring eight inches square. The aforementioned molding can be achieved on a three hundred ton press with adequate tolerance with regard to the uniformity of thickness and accuracy of the location of the channels and holes. By way of comparison, the cost of molds to simultaneously form forty-eight of the same size circuit boards on a common substrate measuring sixteen inches by twenty-four inches might be six to seven times as much, the mold pressure required might be six times as much and significant problems in holding to adequate toleraances would be encountered.

It would be desirable to provide a method of manufacturing molded printed circuit boards that would take advantage of the savings in handling that result from large array or batch processing without incurring the significant expense and tolerance problems associated with using large injection molds to form a common plastic substrate having the substantial area required for many individual boards.

SUMMARY OF THE INVENTION

It is therefore the primary object of the present invention to provide an improved method of fabricating printed circuit boards.

It is another object of the present invention to provide an improved method of fabricating circuit boards of the type that comprises a metallized injection molded plastic substrate.

It is another object of the present invention to provide a method of manufacturing injection molded printed circuit boards that will reduce handling costs.

It is another object of the present invention to provide a method of manufacturing injection molded printed circuiit boards that will avoid high mold costs.

It is another object of the present invention to provide a method of producing injection molded printed circuit boards in large arrays without requiring extremely large mold pressures.

According to the illustrated embodiments of the present invention a plurality of physically separate plastic substrates are injection molded, each with at least one pattern of channels formed in a surface of thereof defining a conductive circuit to be formed. The plurality of substrates are then physically connected in a common planar array either by inserting them in corresponding receptacles in a carrier board, by mating peripheral connecting elements, by using adhesive or by some other suitable connecting mechanism. Where a carrier board with pre-formed receptacles is not utilized, the individual substrates in the array are pierced and replaced. The planar array is processed to simultaneously form a conductive circuit on each substrate consisting of metal deposited in its pattern of channels. The planar array of metallized substrates may then be stuffed with electronic components on an automatic insertion machine and wave soldered. The individual finished circuit boards are then pressed out. This batch processing results in substantial savings in handling costs and avoids the significant expense and tolerance problems associated with using very large molds which would be required to form the large planar array directly.

BRIEF DESCRIPTION OF THE DRAWINGS

FIG. 1 is a plan view of a plastic substrate which has been injection molded to provide a pattern of channels in the upper surface thereof and a plurality of holes therethrough.

FIG. 2 is an enlarged, fragmentary sectional view of the plastic substrate of FIG. 1 taken along line 2—2 of FIG. 1 and illustrating a channel and a hole formed in the substrate.

FIG. 3 is a reduced plan view of a planar carrier board having a plurality of receptacles into each of which a substrate of the type illustrated in FIG. 1 may be inserted.

FIG. 4 is a view illustrating a plurality of the substrates inserted into the planar carrier board of FIG. 3.

FIG. 5 is a sectional view similar to FIG. 2 illustrating the metallization of the substrate.

FIG. 6 is a plan view of an injection molded substrate which may have a plurality of patterns of channels formed therein representing identical conductive circuits to be formed and having mating connecting elements in the form of peripheral flanges.

FIG. 7 is a plan view of six of the substrates of the type illustrted in FIG. 6 physically overlapped and mated to form a common planar array.

FIG. 8 is an enlarged fragmentary side elevation view taken along line 8—8 of FIG. 7 illustrating the mating connection of the peripheral flanges of adjacent substrates of the planar array.

DESCRIPTION OF THE PREFERRED EMBODIMENTS

The entire disclosure of my aforementioned U.S. Pat. No. 4,532,152 entitled "Fabrication of a Printed Circuit Board with Metal-Filled Channels" granted July 30, 1985 is specifically incorporated herein by reference.

As used herein the term "printed circuit board" refers generally to an insulative substrate with a conductive circuit formed thereon. As used herein, the term "plastic" includes any of the substrate materials referred to in my aforementioned U.S. Pat. No. 4,532,152.

FIGS. 1–5 illustrate a first embodiment of my invention. Referring to FIG. 1, a plurality of rectangular plastic substrates such as 10 are injection molded to provide a pattern of channels 12, a plurality of holes 14, and a pair of holes 16. The pattern of channels 12 is formed in the upper surface of the substrate and defines a conductive circuit to be formed. An additional pattern of channels may be formed in the lower surface of the substrate where a double sided board is desired, i.e. a printed circuit board with conductive circuits on both sides thereof. The holes 14 in the substrate receive the leads of the electronic components which are to be supported and interconnected on the finished circuit board. The holes 16 receive pins (not illustrated) in later registration of the plurality of connected substrates.

Referring to FIG. 2, the channels 12 define channel surfaces 18 and non-channel surfaces 20. The holes 14 define wall surfaces 22.

Referring to FIG. 3, a rectangular planar carrier board 24 may be formed out of a suitable inexpensive heat resistant material such as phenolic, polyester or even metal. It has a plurality of receptacles 26. Holes 27 in the carrier board receive registration pins. Each receptacle 26 is precisely configured and dimensioned for having a corresponding one of the substrates inserted therein to form a common planar array 28 illustrated in FIG. 4. The substrates 10 and the carrier board 24 have the same thickness so that their upper and lower surfaces are co-planar, i.e. at the same level, to facilitate processing of the array 28 as taught in my aforementioned U.S. Pat. No. 4,532,152 to simultaneously delineate a conductive circuit comprising metal-filled channels 30 and metal coated component lead holes 32.

By way of example, the substrate 10 is injection molded polyimide or polyetherimide. A punch press and magazine apparatus readily constructed by those skilled in the art is used to simultaneously die-cut each receptacle 26 in the phenolic carrier board 24 and automatically insert a molded substrate 10 therein. During this process upstanding pins on a jig may be positioned in the holes 16 of the substrates to facilitate registration. The common planar array 28 with the six substrates 10 inserted therein is passed through a vapor blast machine to simultaneously roughen the channel surfaces 18 and non-channel surfaces 20 of each of the substrates to produce better adherence of the subsequently deposited metal. Next the planar array 28 is immersed into a suitable copper electroless plating bath in order to simultaneously deposit a very thin layer of copper plated onto both the channel surfaces 18 and the non-channel surfaces 20 of each of the substrates. The planar array 28 is then withdrawn from the bath and dried. Thereafter a single roller is passed over the upper surface of the planar array 28 in order to simultaneously coat the non-channel surfaces 20 of each of the six substrates 10 with a suitable resist. Thereafter the planar array 28 is immersed in another bath in order to electroplate a relatively thick layer of copper onto the electroless copper in the channels. The planar array is then removed from the electroplating bath and immersed in a bath or baths of suitable stripping and/or etching solutions for a short duration in order to strip the resist and remove the electroless copper from the non-channel surfaces 20 of each of the substrates 10 while leaving substantially all the electroplated layer of copper in the channels. The planar array of finished circuit boards is then dried and shipped to the customer for simultaneous stuffing of electronic components into the six circuit boards on an automatic inserting machine. The planar array is then passed over a wave solder bath to simultaneously solder the components on each of the six boards. The completed individual circuit boards are then pressed out of the carrier board 24.

FIGS. 6–8 illustrate a second embodiment of my invention. Referring to FIG. 6, a plurality of plastic substrates such as 34 are injection molded so that each has a plurality of patterns of channels (not illustrated) formed in the upper surface thereof defining a plurality of identical conductive circuits to be formed. Each substrate 34 has mating peripheral connectors around the peripheral edges thereof in the form of flanges 36, 38, 40 and 42. As illustrated in FIG. 7, a plurality of the substrates 34 may be physically connected by mating their adjacent flanges to form a common planar array 44.

As illustrated in FIG. 8, each flange extends from a one side edge of the substrate to which it belongs and has a thickness of of approximately half the thickness of the main body portion of the substrate. Referring to FIG. 6, two of the flanges, namely flanges 38 and 40 extend co-planar with the upper surface of the main body portion of the substrate. The other two flanges, namely flanges 36 and 42, extend co-planar with the lower surface of the main body portion of the substrate. Thus when one of the upper flanges such as 38 is mated with one of the lower flanges 36 they overlap as illustrated in FIG. 8.

The flanges have holes 46 and 48 (FIG. 6) therein. The holes in the flanges forming the periphery of the array 44 are available for receiving the upstanding pins of a jig (not illustrated) for facilitating the proper registration of the substrates 34. These same holes are also useful in registering the planar array on an automatic insertion machine. When a flange such as 40 of one substrate having two holes 46 overlaps a flange such as 36 having four holes 48, the two holes 46 register with the outer two of the four holes 48 (see FIG. 7). Failure of these holes to register in this manner indicates defective parts. The inner two holes 48 define wells having the flange 40 as the bottom thereof. Small droplets of a suitable adhesive (not illustrated) are deposited in these walls and flow between the flanges to cement them together.

By way of example, methylene chloride may be used as an adhesive where the substrates 34 are made of polyetherimide such as that sold under the trademark ULTEM by General Electric Company. The assembled planar array 44 illustrated in FIG. 7 is placed in position relative to a suitable punch press to pierce and replace individual circuit enclosing sections of each substrate. Thereafter the array 44 is processed as already described in order to simultaneously delineate a conductive circuit on each substrate consisting of metal deposited in the channels thereof. The array of finished printed circuit boards is then shipped to the customer, stuffed with components and wave soldered. The customer then presses out the separate finished circuit boards.

Having described two separate embodiments of my method of manufacturing injection molded printed circuit boards it should be apparent to those skilled in the art that my invention may be modified in both arrangement and detail. For example, the substrates could be molded with connectors that would not require any adhesive or the substrates could be held togther by adhesive without any peripheral mating connectors. Therefore the protection afforded my invention should only be limited in accordance with the scope of the following claims.

I claim:

1. A method of producing circuit boards, comprising the steps of:
   injection molding a plurality of physically separate plastic substrates each having at least one pattern of channels formed in a surface of thereof;
   physically connecting the plurality of substrates in a common planar array;and
   processing the array of substrates to simultaneously delineate a conductive circuit on each substrate consisting of metal deposited in its pattern of channels.

2. A method according to claim 1 wherein each substrate has a plurality of patterns of channels formed in the surface thereof and the array of substrates is processed to simultaneously delineate a plurality of circuits on each substrate consisting of metal deposited in its plurality of patterns of channels.

3. A method according to claim 1 wherein the plurality of substrates are inserted into receptacles in a planar carrier board.

4. A method according to claim 1 wherein each substrate is injection molded with a plurality of mating connecting elements around a set of peripheral edges thereof and the substrates are physically connected by mating the connecting elements of adjacent ones of the substrates.

5. A method according to claim 1 wherein the plurality of substrates are physically connected with an adhesive compound.

6. A method according to claim 4 wherein the plurality of substrates are further physically connected with an adhesive compound applied to the mated connecting elements.

7. A method according to claim 4 wherein the mating connecting elements comprise flanges.

8. A method according to claim 7 wherein each substrate has a plurality of flanges which are configured, dimensioned and located for overlapping engagement with the flanges of the substrates immediately adjacent thereto.

9. A method according to claim 8 wherein each substrate has a rectangular shape, each flange extends from a corresponding side edge of the substrate and has a thickness approximately half a thickness of a main body portion of the substrate, two of the flanges extend co-planar with an upper surface of the substrate and the other two of the flanges extend co-planar with a lower surface of the substrate.

10. A method according to claim 3 wherein the planar carrier board is made of a material selected from the group consisting of phenolic, polyester and metal.

* * * * *